United States Patent [19]

Lean

[11] 4,084,189
[45] Apr. 11, 1978

[54] ACOUSTRO-ELECTRIC SCANNER BY PHONON ECHO PHENOMENON

[75] Inventor: Eric Gung-Hwa Lean, Mahopac, N.Y.

[73] Assignee: International Business Machines Corporation, Armonk, N.Y.

[21] Appl. No.: 645,109

[22] Filed: Dec. 29, 1975

[51] Int. Cl.² ............................................. H04N 3/14
[52] U.S. Cl. ................................. 358/213; 310/313; 310/334
[58] Field of Search ................... 178/7.1, 7.6; 350/161 W; 310/9.8, 8.1, 8.3; 358/209, 213, 285

[56] References Cited

U.S. PATENT DOCUMENTS

| | | | |
|---|---|---|---|
| 3,826,865 | 7/1974 | Quate et al. | 178/7.1 |
| 3,903,364 | 9/1975 | Lean | 178/7.1 |
| 3,944,732 | 3/1976 | Kino | 178/7.1 |
| 3,970,778 | 7/1976 | Adkins | 178/7.1 |

*Primary Examiner*—Robert L. Griffin
*Assistant Examiner*—Arstotelis M. Psitos
*Attorney, Agent, or Firm*—Pollock, Vande Sande & Priddy

[57] ABSTRACT

A thin film optical scanner using phonon echoes. A piezoelectric (an insulator or a semiconductor) crystal has deposited thereon a photoconductor. An acoustic transducer propagates a broad strain wave pulse guided in or on the crystal. A relatively shorter electric field pulse is coupled to the piezoelectric crystal through the photoconductor which has an optical signal focused thereon. The interaction of electric field and strain wave produce a backward travelling acoustic wave which is modulated by the optical signal.

18 Claims, 12 Drawing Figures

ACOUSTRO-ELECTRIC SCANNER BY PHONON ECHO PHENOMENON

FIELD OF INVENTION

The present invention relates to optical scanners, and more particularly, optical scanners which rely on a parametric interaction in a piezoelectric crystal, of an acoustic wave such as an ASW and an electric field modulated by an optical signal.

BACKGROUND OF THE INVENTION

The presence of echoes, or backward propagating waves, in piezoelectric crystals has recently been reported, see Shiren et al "Echo Phenomenon in Piezoelectric Crystals," Physical Review Letters, Vol. 31, No. 13, Sept. 24, 1973 (pages 819–822) and Melcher et al "Parametric Field Echoes in Cds" (pages 558–560). Melcher et al have also suggested that this effect can be applied to an optical scanner for converting optical information to amplitude modulated radio frequency information suitable for data transmission, see the copending Melcher and Shiren application Ser. No. 643,971, filed Dec. 29, 1975. Such an apparatus could be constructed, according to the Melcher et al suggestion, by employing a piezoelectric substrate upon which a photosensitive semiconductor is depositioned, the combination of which structure is included between a pair of electrodes, one of which is transparent. An optical image is focused on the photosensitive semiconductor and an acoustic wave is propagated in the piezoelectric substrate. When the acoustic wave reaches the location of the photosensitive semiconductor an electric field is applied thereto exciting charge carriers which are trapped at impurity states in the photosensitive semiconductor in a spatial distribution reflecting the light intensity distribution. The electric field applied to the photosensitive semiconductor redistributes the space charge into a cosine gratng which exists only in the areas of the photosensitive semiconductor which were illuminated. At a later time, a second electric field pulse is applied to excite the grating generating forward and backward surface acoustic waves, either or both of which can be converted by transducers into RF signals which are amplitude modulated with optical information. Melcher et al further suggested that a backward acoustic wave could be generated by a single electric field pulse. The magnitude of this backward wave is determined by the number density of filled impurity states (traps) in the crystals. The local number density is in turn determined by the light intensity at a given point in the crystal. Therefore, the backward wave in such a device is amplitude modulated by the light intensity.

Although such devices appear to be feasible they do present a number of disadvantages. In the first place, since the modified device as suggested by Melcher et al, relies upon charge carriers excited by the light intensity in a photosensitive semiconductor, the same effect results in rather high losses to the acoustic surface wave pulse. In addition, the necessity for the material chosen as the photosensitive semiconductor to exhibit both photosensitive and semiconducting properties makes it difficult to select a material having optimal characteristics as both a photoconductor and a semiconductor.

It is therefore one object of the present invention to provide an optical scanner relying upon echoes in piezoelectric crystals which does not rely upon excitation of charge carriers in a photosensitive semiconductor, and which thus does not result in attenuation of the acoustic wave for this reason. It is another object of the present invention to provide an optical scanner of the foregoing type which does not rely upon excitation of charge carriers in a photosensitive semiconductor so as to allow optimal selection of materials for the device.

SUMMARY OF THE INVENTION

These and other objects of the invention are met by providing an optical scanning device including a piezoelectric crystal having a pair of major surfaces, a photoconductor deposited on one of said major surfaces with an active area. An acoustic transducer such as a surface wave transducer is located on said photoconductor outside of the active area and electrode means is provided to couple an electric field to the piezoelectric crystal through the photoconductor in the active area. A focusing system focuses an optical image on the active area of the photoconductor. A relatively broad acoustic pulse is propagated by the transducer, the length of the pulse is equivalent to the extent of the active area of the photoconductor. When the pulse registers with the active area of the photoconductor, upon which the focusing system images the desired optical signal, the electrode system is energized to couple an electric field through the photoconductor to the piezoelectric crystal. The parametric interaction of the propagating strain wave, on the piezoelectric crystal, and the electric field produces a backward travelling acoustic wave. Since the electric field is coupled to the piezoelectric crystal through the photoconductor, the optical image modulates the amplitude of the electric field which is so coupled. As a result, the backward travelling wave is also amplitude modulated in accordance with the spatial distribution of the optical signal imaged on the photoconductor. The same transducer which propagated the forward travelling pulse can be employed to transduce the backward traveling wave into an amplitude modulated RF signal whose amplitude modulation corresponds to the spatial distribution of the optical signal imaged on the photoconductor.

The inventive apparatus can be employed as an optical scanning device by illuminating a narrow area, or "line" of an object containing optical information, such as a printed page. As the object moves past the scanner a driving source produces properly timed electrical energy to energize the transducer, and the electrode system produces the necessary electric field, synchronized with the driving source. When the backward travelling wave reaches the transducer, the amplitude modulated RF signal is produced by the transducer. In this fashion, the optical information contained in an object can be broken down into number of "lines" of arbitrary width, and each line sequentially scanned and converted to an RF electrical signal for readout.

BRIEF DESCRIPTION OF THE DRAWINGS

The present invention will be disclosed with reference to the attached drawings in which like reference characters identify identical apparatus and in which.

DETAILED DESCRIPTION OF PREFERRED EMBODIMENTS

Figure 1A:
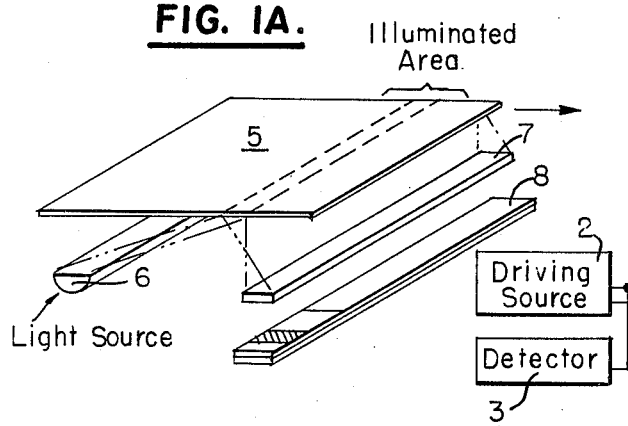
FIG. 1A illustrates an object reader employing the scanner of this invention.

Before describing several preferred embodiments of the present invention it will be helpful, in order to more clearly understand the improvements of this invention over the prior art, to describe the prior suggestions of Melcher et al.

They suggested an optical scanning device based on the parametric interaction of a forwardly propagating acoustic wave in piezoelectric crystal with an applied electric field. More particularly, they suggested placing a photosensitive semiconductor atop a piezoelectric crystal and progagating an elastic wave in the piezoelectric crystal. A pair of electrodes are supplied to provide an electric field through said photosensitive semiconductor. An optical signal is focused on the photosensitive semiconductor. The electric field is energized when an acoustic wave reaches the location of the photosensitive semiconductor. The interaction of the acoustic wave and the electric field parametrically generates a backward acoustic wave whose amplitude is determined by the number density of filled impurities states (traps) in the photosensitive semiconductor. The local number density is in turn determined by the light intensity at a given point.

The backward travelling acoustic wave, which is the result of the parametric interaction, is a function of the number density of filled impurities states (traps), the amplitude of the forwardly propagating elastic wave and the amplitude of the electric field. From the foregoing description of the Melcher et al suggestion it is apparent that they rely upon modulating the local number density of filled impurity states to produce a backward travelling acoustic wave which is modulated with desired information. The device of my invention does not operate on this principle, but rather relies upon modulation of the electric field to result in a modulated backward travelling acoustic wave.

To modulate the electric field I employ a photoconductor, overlying the piezoelectric crystal. By coupling the electric field to the piezoelectric crystal through the photoconductor I can modify (modulate) the electric field in accordance with an optical signal which is focused on the photoconductor. In some of the embodiments which will be described, the photoconductor acts as a photo-induced shunt resistor for the applied electric field substantially preventing the electric field, locally, from interacting with the piezoelectric crystal, in areas where the photoconductor is illuminated. In other areas, of course, where the photoconductor is unilluminated, the shunt resistor will have a relatively high value, allowing the electric field to couple into the piezoelectric crystal. In this embodiment the areas of the photoconductor which are illuminated will have relatively low resistance, allowing substantially the entire electric field to couple into the piezoelectric crystal. In the unilluminated areas the equivalent resistance of the photoconductor (local) will be relatively high, thus, substantially preventing the electric field from coupling into the piezoelectric crystal. In this fashion, then I spatially modulate the electric field which is allowed to couple into the piezoelectric crystal in accordance with the optical information focused on the photoconductor.

The amplitude of the backward travelling wave $E_b$ is defined by $\phi_n SE_2$ wherein $\phi_n$ is the number density of filled states, S is the forward propagating acoustic wave and $E_2$ is the electric field. From the preceding discussion it should be apparent that the Melcher et al suggestion relies on varying $\phi_n$ in order to modulate $E_b$ whereas in my invention I rely on varying the effective field $E_2$ through action of the photoconductor.

Before describing several preferred embodiments it will also be helpful to the reader to understand one typical setting in which the optical scanner of my invention may be employed. It should be understood, of course, that the setting to be explained is not limitive of the various uses of my invention but is merely exemplary.

FIG. 1A illustrates a typical application for the optical scanner of my invention. In particular, an optical information bearing object 5 moves across an illuminated area, in the direction of the arrow by means not illustrated. The illuminated area is defined by a light source 6. The reflection from the illuminated area is focused by focusing system 7 onto the scanner 8. Although the object bearing optical information may comprise a wide variety of objects, a typical such object is a page carrying graphical or alphanumeric information.

Figure 1B:
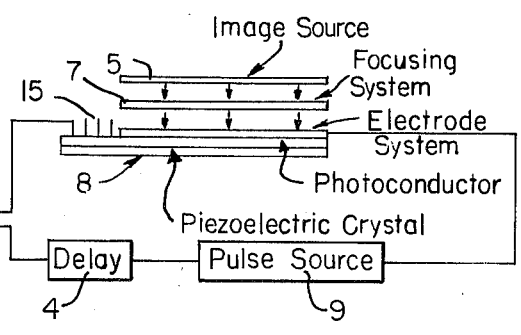
FIG. 1B is a cross-section of FIG. 1A showing the optical and electrical cooperation in schematic form.

FIG. 1B illustrates the scanner 8 and its cooperation with the focusing system 7 and image source 5. FIG. 1B is a cross-section of FIG. 1A in the plane of the optical path. More particularly, an optical image is derived from the image source 5 and is focused by the focusing system 7 onto the scanner 8. The scanner 8 includes a transducer 15 conductively connected to a driving source 2 and a detector 3. The transducer 15 may be an acoustic surface wave transducer although any guided acoustic wave may be employed. Driving source 2 provides a source of energy for driving the ASW transducer 15 to produce the acoustic wave in the scanner 8. The backward travelling wave, which will be produced as a result of the parametric interaction, is transduced by ASW transducer 15 into an electrical signal which is detected by detector 3. The scanner itself comprises a piezoelectric crystal which carries a photoconductor. An electrode system, is also illustrated in FIG 1B, for providing the electric field component necessary for the parametric interaction and the production of the backward travelling acoustic wave.

Figure 1C:
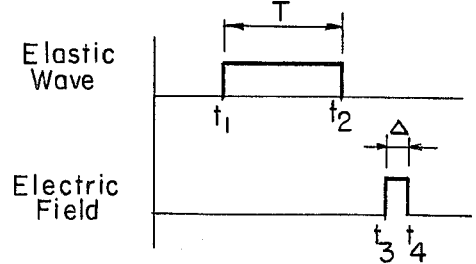
FIG. 1C is a timing diagram showing the relationships of certain signals employed in the inventive scanner.

FIG. 1C illustrates the relative time of application, and duration, of the acoustic wave propagated by the ASW transducer 15 and the electric field provided by the electrode system. More particularly, the acoustic wave is illustrated as beginning at a time T1 and extending to a timer T2, the duration of the pulse T(T2 − T1) is at least equal to the length of the electrode system divided by the propagation velocity of the acoustic wave. Typically, the length of the electrode system might be five centimeters and the velocity of propagation, in a suitable material, could be $3 \times 10^5$ cm/sec. giving a pulse duration T of at least approximately 16.6 microseconds. The delay between the termination of the acoustic wave (T2) and the application of the electric field (T3) is determined by the distance between the ASW transducer 15 and the electrode system, divided by the propagation velocity. A practical duration for the electric field pulse $\Delta$ is 8 nanoseconds. With these parameters the total resolution, i.e., the number of "spots" which can be detected in a 5 centimeter length is about 2,000, actually it is $T/\Delta$.

In operation, the driving source 2 is periodically enabled, by means not illustrated, to energize the transducer 15. After a suitable delay, represented by delay 4 to allow the acoustic wave produced by ASW transducer 15 to register with the electrode system, the electrode system is energized, by pulse source 9, to produce the necessary electrical field. At this time the electric field couples to the piezoelectric crystal where it produces a backward travelling acoustic wave which, when it reaches the transducer 15 will be converted into an electrical signal. The electric field which reaches the piezoelectric crystal is modulated by the optical information varying the conduction of the photoconductor. This modulation, which is the mechanism I rely on to provide a modulated backward travelling acoustic wave will be explained in more detail with reference to specific embodiments of my invention.

Figure 2A:
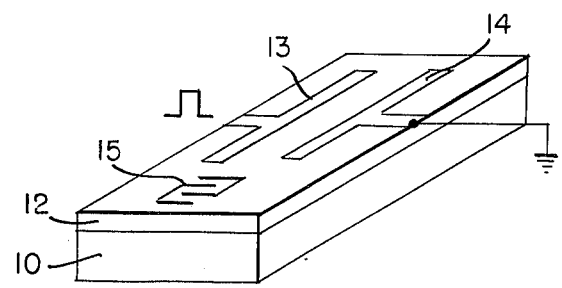
FIG. 2A is one embodiment of the inventive scanner.
Figure 2B:
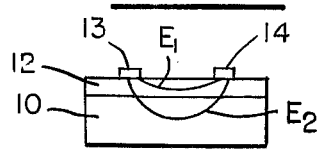
FIG. 2B is a cross-section of FIG. 2A useful in explaining the modulation process.
Figure 2C:
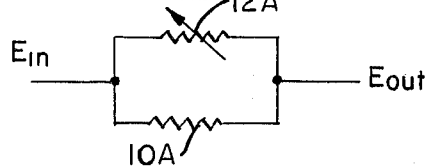
FIG. 2C is an electrical analog of FIG. 2B useful in explaining the modulation process.

One specific embodiment of my invention is illustrated in FIGS. 2A through 2C. FIG. 2A illustrates a piezoelectric crystal having a pair of major surfaces and supporting, on one major surface, a photoconductor 12. The photoconductor 12 carries an ASW transducer 15 of conventional form. For simplifying the illustration the conductive connections between ASW transducer 15, the driving source 2 and detector 3, are not illustrated. The photoconductor 12 also supports an electrode system including a pair of electrodes 13 and 14. As illustrated, the electrodes are rectangular in form and parallel to each other. As diagrammatically illustrated in FIG. 2A one of these electrodes, electrode 14, is grounded, the other of the electrodes is connected to pulse source 9 for producing an electric field. For effective operation the electrodes 13 and 14 should be at least co-extensive with the longitudinal extent of the area in which the focusing system 7 focuses the optical signal from the image source 5.

The piezoelectric crystal may be insulating or semiconducting and may comprise $LiNbO_3$, $LiTaO_3$, AnO, CdS, GaAs or other materials having like piezoelectric characteristics. The photoconductor 12 can comprise an organic or inorganic photoconductor such as CdS, CdSe, etc.

The illuminated area depends, of course, on the width of the object being illuminated as well as on the length, along the length of the object being illuminated, which is illuminated. The scanner is essentially a unidimensional device, i.e., the amplitude of the backward travelling wave at any point in time, corresponds to a particular point along the major dimension of the scanner. This amplitude is the sum of the interactions produced across the width of the scanner at that point. Preferably, therefore, the optical signal is substantially unidimensional. To this end the width of the illuminated area should be relatively small, i.e., 0.05 centimeters.

To explain the manner in which the optical signal is employed to modulate the electric field, FIGS. 2B and 2C will be helpful. FIG. 2B is an arbitrary cross-section of FIG. 2A taken through any point within the area bounded by the electrodes 13 and 14. Conceptually, the spatial variations of the electric field coupling the piezoelectrc crystal 10 can be determined by summing a number of such cross-sections. FIG. 2C is an elementary electrical analog corresponding to the cross-section of FIG. 2B. More particularly, as is illustrated in FIG. 2B, when a voltage is applied between electrodes 13 and 14, an electric field couples the electrodes. Depending upon the relative resistivity of photoconductor 12 and piezoelectric crystal 10, the electric field may or may not couple into the piezoelectric crystal 10. Electric field lines $E_1$ and $E_2$ are thus alternative electric field distributions. For effective operation the resistivity of the photoconductor should vary under dark and light conditions so that the resistance offered to the electric field under dark conditions in the photoconductor 12 is much larger than the resistance offered to the electric field in the piezoelectric crystal 10. Under light conditions, on the other hand, the resistance offered the electric field in the photoconductor should be approximately equal to the resistance offered to the electric field by the piezoelectric crystal 10 As a result, under dark conditions there will be little, if any, coupling of the electric field solely in the photoconductor 12, and a majority of the electric field will couple into the piezoelectric crystal 10 where it is available to interact with the acoustic wave. On the other hand, under light conditions, a significant portion of the electric field will not couple into the piezoelectric crystal 10. In this fashion, the optical signal modulates the extent to which the electric field is coupled to the piezoelectric crystal 10. In effect, therefore, the photoconductor 12 offers a variable resistance, in shunt with the piezoelectric crystal 10. This operation is illustrative shown in FIG. 2C wherein a resistor 10A, corresponding to the resistance of the piezoelectric crystal, is in parallel with the variable resistor 12A, corresponding to the resistance offered by the photoconductor 12. Under the mechanism explained above the electric field is reduced in amplitude in relation to the light intensity. Since the amplitude of the backward travelling acoustic wave is proportional to the amplitude of the electric field, the backward travelling wave amplitude will correspond to the reciprocal of the light signal. That is, presence of light will result in a low amplitude backward travelling acoustic wave, whereas the absence of light will result in a relatively larger amplitude backward travelling acoustic wave. With the foregoing scanner the gap between the electrodes can be 1 mil and the voltage producing the electric field can be less than 20 volts.

Figure 3A:
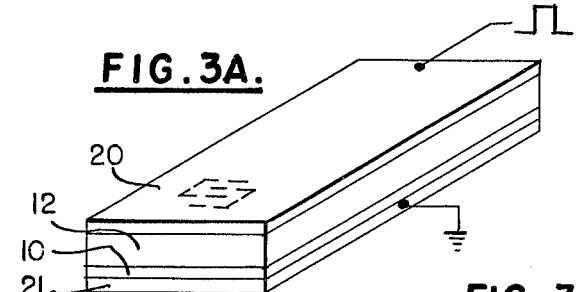
FIG. 3A is another embodiment of the inventive scanner.
Figure 3B:
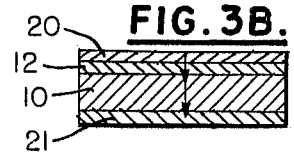
FIG. 3B is a cross-section of FIG. 3A useful in explaining the modulation process.
Figure 3C:
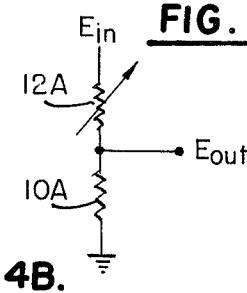
FIG. 3C is an electrical analog of FIG. 3B useful in explaining the modulation process.

FIGS. 3A, 3B and 3C are related to another embodiment of the invention which differs from the previously described embodiment mainly in the orientation of the electrodes with regard to the surface of the piezoelectric crystal 10. In the previously described embodiment the electrodes 13 and 14 employed for applying an electric field to the piezoelectric crystal 10 are disposed essentially in a plane parallel to the plane of a major surface of the crystal. In this embodiment, however, the electrodes 20 and 21 are disposed in different planes, each of which is, however, parallel to a plane of a major surface of the piezoelectric crystal 10. Thus, as illustrated in FIG. 3A a piezoelectric crystal 10 having a pair of major surfaces has a photoconductor 12 supported on one of said major surfaces. An electrode 21 is arranged parallel to and adjacent a second of the major surfaces of the crystal 10. Finally, a transparent electrode 20 overlies the photoconductor 12 in a plane parallel to the major surfaces of the crystal 10. An ASW transducer 15 is deposited on the photoconductor 12, in a manner similar to that illustrated in FIG. 2A. Just as in FIG. 2A the conductive connections to the ASW transducer 15 have been omitted for purposes of clarity. Aside from the different orientation of electrodes 20 and 21, with respect to the crystal 10, the embodiments of FIGS. 2A and 3A can employ the same physical dimensions. That is, the embodiment of FIG. 3A has a line of "spots" focused thereon by a focusing system. The spatial distribution of this light intensity will be converted to an RF electrical signal by the operation of the transducer.

In order to explain the manner in which the backward travelling wave is produced as a result of the parametric interaction between the forward travelling acoustic wave and the applied electric field, the cross-section of FIG. 3B will be employed. FIG. 3B is a cross-section of the scanner taken at any arbitrary plane with the single restriction being that the cross-section is taken within the active area of the photoconductor 12, i.e., the area in which the light signal is impinging. Just as in the previous embodiment the forward travelling acoustic wave is launched from the ASW transducer 15. When that wave registers with the active area of the photoconductor, i.e., the area upon which the light signal is focused, the electric field is energized for a short predetermined period, such as the 8 nanoseconds referred to above. The extent to which the electric field is allowed to couple into the piezoelectric crystal 10 to enter into the interaction with the acoustic wave is dependent upon the resistance interposed to that electric field by the photoconductor 12. In those areas in which there is a relatively high light intensity impinging on the photoconductor 12 it will have a relatively low resistance and therefore most of the electric field will be coupled into the piezoelectric crystal 10. On the other hand, where the light intensity is relatively small, the photoconductor 12 will offer relatively large amounts of resistance to the electric field and thus a relatively smaller percentage of the electric field will be allowed to couple into the piezoelectric crystal 10. As a result, the electric field which is coupled into the piezoelectric crystal 10 will have a spatial distribution corresponding to the spatial distribution of light intensity. Since the amplitude of the backward travelling acoustic wave produced as a result of the parametric interaction is proportional to the amplitude of the electric field which enters into the interaction, such backward travelling wave will also have an amplitude which is spatially a function similar to that of the light intensity.

Much in the manner of FIG. 2C, FIG. 3C is an electrical analog of this operation wherein a series of resistors 12A and 10A are connected to a potential source $E_{in}$. The resistor 12A is variable corresponding to the variable resistance offered to the electric field by the photoconductor 12 depending upon the locally impinging light intensity. Thus, the output voltage, $E_{out}$ will be a function of the local value of resistance corresponding to the resistor 12A. Thus, in the embodiment of FIG. 3A the photoconductor 12 acts as a series dropping resistor, rather than as the shunt resistor of the embodiment of FIG. 2A. Those of ordinary skill in the art will appreciate, from the foregoing, the manner in which a suitable conductor, and the thickness thereof, can be determined from the preceding discussion.

Figure 4A:
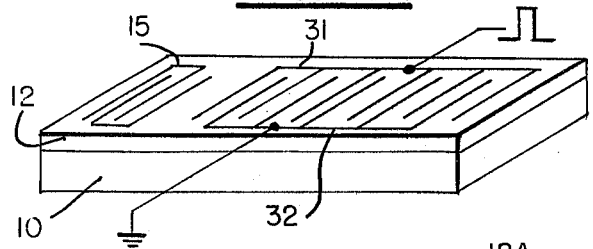
FIG. 4A is another embodiment of the inventive scanner.
Figure 4B:
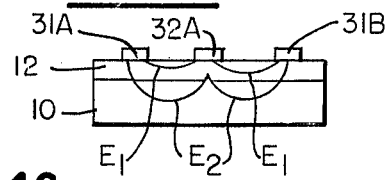
FIG. 4B is a cross-section of FIG. 4A useful in explaining the modulation process.
Figure 4C:
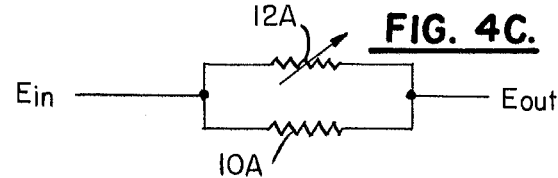
FIG. 4C is an electrical analog of FIG. 4B useful in explaining the modulation process.

Still another embodiment of the invention is illustrated in FIG. 4A, and its operation will be explained with reference to that Figure as well as with FIGS. 4B and 4C. This embodiment differs from the previous two embodiments in the disposition of the electrode system with regard to the piezoelectric crystal 10. As is illustrated in FIG. 4A, a piezoelectric crystal 10 having a pair of major surfaces carries a photoconducting layer 12 on one of said major surfaces. An ASW transducer 15 is located on said photoconducting layer for launching the acoustic wave which is one element necessary to the interaction to produce the backward travelling wave modulated in accordance with the light signal. The focusing system, not shown, is provided to focus the optical signal upon the photoconducting layer 12 in an area encompassed by the interdigital electrodes 31 and 32. As is illustrated in FIG. 4A the electric field pulse is applied between electrodes 31 and 32. The timing of the acoustic wave and application of the electric field is the same as that illustrated in FIG. 1C. Upon application of the electric field, at a time when the acoustic wave registers with the extent of the interdigital electrodes 31 and 32, a backward travelling acoustic wave is produced $E_b$. To illustrate the manner in which the amplitudde of the backward travelling wave is modulated by the spatial variation of light intensity reference is now made to FIG. 4B. FIG. 4B is a cross-section of the scanner illustrated in FIG. 4A taken on a plane perpendicular to the major surfaces of the crystal 10 in a direction parallel to the forward travelling acoustic wave. In addition to the crystal 10 and photoconducting layer 12, FIG. 4B illustrates electrodes 31A and 31B, conductively connected to electrode 31 and forming a part thereof as well as electrode 32A which is connected to, and forms a part of interdigital electrode 32. Clearly, electrodes 31A and 31B will be at the same potential whereas there will be a potential difference between those electrodes and electrode 32A. Potential field lines $E_1$ and $E_2$ illustrate two classes of possible paths for the potential field arising by reason of this potential difference. The potential field lines $E_2$ are shown as linking with the piezoelectric crystal 10 and therefore such field is capable of interacting with the forwardly travelling acoustic wave launched by transducer 15. On the other hand, the alternative potential field line $E_1$ does not link the piezoelectric crystal. As a result, no interaction between such an electric field and the forward travelling acoustic wave occurs. In this embodiment the photoconducting layer 12 acts as a potential shunt to electric field line, when illuminated, preventing such lines from linking the piezoelectric crystal 10. Thus, in areas where the photoconducting layer 12 is highly illuminated, the local resistance will be so low as to prevent a substantial portion of the electric field from linking the piezoelectric crystal 10. On the other hand, in areas where the photoconducting layer 12 is not illuminated, or illuminated weakly, the relatively high local resistivity of the layer 12 will allow relatively larger portion of the field lines to link the piezoelectric crystal 10. Thus, FIG. 4C illustrates an electrical analog of this condition wherein the crystal 10 is illustrated by a resistor 10A and the photoconducting layer 12 corresponds to the variable resistor 12A. Of course, where local light intensity is relatively high the resistor 12A would have low resistance, and corresponding with the local light intensity is low, the resistor 12A would have a high resistance. As a result of the spatial variation of light intensity, therefore, the electric field amplitudes which are capable of interacting with the acoustic wave are varied. Since the amplitude of the backward travelling acoustic wave produced as a result of the interaction is proportional to the amplitude of the electric field, this directly results in amplitude modulation of the backward travelling acoustic wave.

I claim:

1. An optical signal scanner for converting a substantially unidimensional optical signal to an electrical signal comprising, focusing means for focusing said optical signal, a parametric interaction means including a piezoelectric crystal, an acoustic transducer and an electric field producing means including a pair of electrods for producing an acoustic wave $E_b$ travelling towards said acoustic transducer whose amplitude is $\phi_n SE_2$ where $\phi_n$ is the number density of filled impurity states in said piezoelectric crystal, S is a forward acoustic wave propagated by said acoustic transducer and $E_2$ is an electric field applied by said pair of electrodes transverse to the direction of said acoustic wave, wherein said acoustic transducer is effective to transducer $E_b$ to an electrical signal, wherein the improvement comprises, photoconducting means included in said parametric interaction means on which said optical signal is focused, said photoconducting means disposed between at least one of said pair of electrodes and said piezoelectric crystal, said photoconducting means responsive to said optical signal for locally varying the amplitude of $E_2$ coupled to said piezoelectric crystal to modulate $E_b$.

2. The apparatus of claim 1 wherein said forward acoustic wave is of a duration corresponding to the extent of said optical signal and said electric field is applied by said pair of electrodes at a time when said forward acoustic wave registers with the extent of said optical signal on said photoconducting means.

3. The apparatus of claim 2 wherein said pair of electrodes has a dimension corresponding to the extent of said optical signal, as focused on said photoconducting means.

4. The apparatus of claim 3 in which both said pair of electrodes lie substantially in a plane parallel to a direction of said forward acoustic wave, each of said pair of electrodes surrounding a portion of said photoconducting means in which said optical signal is focused.

5. The apparatus of claim 3 wherein each of said pair of electrodes lies in a different plane, parallel to each other, each having a dimension at least co-extensive with the extent of said optical signal focused on said photoconducting means, one of said electrodes being a transparent electrode.

6. The apparatus of claim 5 wherein said piezoelectric crystal is disposed between said pair of electrodes.

7. The apparatus of claim 3 wherein each of said pair of electrodes is an interdigital electrode lying in a plane of said acoustic surface wave transducer and having a dimension co-extensive with the extent of said optical signal as focused on said photoconducting means.

8. A method of converting a unidimensional optical signal to an electric signal employing parametric interaction in a piezoelectric crystal between an acoustic wave and a transverse electric field comprising the steps of, focusing said optical signal at a predetermined area adjacent said crystal, launching said acoustic wave toward said area, applying said electric field when said acoustic wave reaches said area, modulating said electric field by said optical signal to allow said interaction to take place between said acoustic wave and said modulated electric field, and transducing the resulting acoustic wave to an electric signal.

9. The method of claim 8 wheren said modulating step includes a step of locally shunting said electric field to an extent corresponding to intensity of said optical signal.

10. The method of claim 9 wherein said shunting step includes a step of providing a photoconducting region lying between an electric field source and said crystal.

11. The method of claim 8 in which said modulating step includes a step of locally impeding said electric field in accordance with local optical intensity.

12. An optical signal scanner for converting a line of optical dot signals to an electric signal comprising:

a piezoelectric crystal having a pair of major surfaces, photoconductor means of at least predetermined length supported on one of said major surfaces of said piezoelectric crystal, electrode means and means for driving said electrode means coupled thereto for coupling an electric field to said piezoelectric crystal through said photoconductor means, focusing means for focusing said line of optical dot signals on said predetermined length of said photoconductor means, transducer means for launching an acoustic wave on said crystal having a duration commensurate with said predetermined length, said means for driving said electrode means operating when said acoustic wave registers with said predetermined length of said photoconductive means, whereby a backward acoustic wave is produced by parametric interaction of said acoustic wave and said electric field modulated by said optical dot signal which modulated acoustic wave is transduced to an electrical signal by said transducer means.

13. The apparatus of claim 12 in which said electrode means comprise a pair of electrodes having a dimension at least co-extensive with said line of optical dot signals as focused on said photoconductor.

14. The apparatus of claims 13 wherein both said electrodes lie substantially in a plane parallel to a major surface of said piezoelectrid crystal, each of said pair of electroes disposed in said plane with said focused line of optical dot signals lying therebetween.

15. The apparatus of claim 13 wherein said pair of electrodes lie substantially in a pair of planes each parallel to major surfaces of said crystal, with said crystal disposed between said electrodes, one of said electrodes lying between said photoconductor means and said focusing means, said one electrode being transparent.

16. The apparatus of claim 13 in which said pair of electrodes lie substantially in a single plane parallel to a major surface of said crystal, said electrodes being coextensive with said line of optical dot signals as focused on said photoconductor means.

17. The apparatus of claim 14 wherein each of said electrodes comprises an interdigital electrode.

18. The apparatus of claim 12 in which said transducer is an acoustic surface wave transducer.

* * * * *

UNITED STATES PATENT AND TRADEMARK OFFICE
CERTIFICATE OF CORRECTION

PATENT NO. : 4,084,189
DATED : April 11, 1978
INVENTOR(S) : Eric G. Lean

It is certified that error appears in the above-identified patent and that said Letters Patent are hereby corrected as shown below:

Please correct the title to read --ACOUSTO-ELECTRIC SCANNER BY PHONON ECHO PHENOMENON--

In column 1, line 21, the date should be --December 24--; on line 24, change "depositioned" to --deposited--.

In column 4, line 65, "timer" should be --time--.

In column 5, 3 lines from bottom, "0.05" should be --.05--.

In column 8, line 25, correct spelling of --amplitude--.

In column 9, claim 1, line 7, correct spelling of "electrodes" in line 16, change "transducer" to --transduce--.

In column 10, claim 12, line 19, change "photoconductive" to --photoconductor--.

In claim 14, line 3, correct spelling of "piezoelectric", and in line 4, correct spelling of "electrodes".

Signed and Sealed this

Tenth Day of October 1978

[SEAL]

Attest:

RUTH C. MASON
Attesting Officer

DONALD W. BANNER
Commissioner of Patents and Trademarks